(12) United States Patent
Ito

(10) Patent No.: US 7,215,172 B2
(45) Date of Patent: May 8, 2007

(54) CLAMPING CIRCUIT TRANSISTOR DRIVING CIRCUIT USING THE SAME

(75) Inventor: Kenji Ito, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/295,536

(22) Filed: Dec. 7, 2005

(65) Prior Publication Data

US 2006/0119409 A1    Jun. 8, 2006

(30) Foreign Application Priority Data

Dec. 7, 2004  (JP)  ............................ 2004-354231
Aug. 23, 2005  (JP)  ............................ 2005-241135

(51) Int. Cl.
*H03K 5/08* (2006.01)

(52) U.S. Cl. ...................... 327/309; 327/328
(58) Field of Classification Search ................ 327/309, 327/312, 321, 328
See application file for complete search history.

(56) References Cited

U.S. PATENT DOCUMENTS 5,436,552 A    7/1995  Kajimoto .................... 323/313

| | | | | |
|---|---|---|---|---|
| 5,939,921 A | * | 8/1999 | Strauss et al. .............. | 327/322 |
| 6,028,466 A | * | 2/2000 | Hartley ....................... | 327/328 |
| 6,281,735 B1 | * | 8/2001 | Page ........................... | 327/309 |
| 6,954,108 B2 | * | 10/2005 | Hastings et al. ............ | 330/298 |
| 6,958,742 B2 | * | 10/2005 | Date et al. .................... | 345/90 |

* cited by examiner

*Primary Examiner*—My-Trang Nu Ton
(74) *Attorney, Agent, or Firm*—Posz Law Group, PLC

(57) ABSTRACT

A clamping circuit including a current mirror circuit including transistors constituting a mirror pair disposed at ground side, each of the transistors being connected to a power source through a resistance element; a plurality of adjusting transistors connected in parallel to a first transistor as one transistor of the current mirror circuit at a side for determining mirror current flowing in the current mirror circuit; a plurality of switch circuits that are respectively connected to conduction control terminals of the plural adjusting transistors in connection with one another and control the conduction states of the corresponding adjusting transistors; and a clamping transistor that has a conduction control terminal connected to a power source side terminal of a second transistor as the other transistor of the mirror pair, and clamps a voltage applied to a clamp terminal with the potential of the conduction control terminal as a reference.

9 Claims, 4 Drawing Sheets

CLAMPING CIRCUIT TRANSISTOR DRIVING CIRCUIT USING THE SAME

CROSS REFERENCE TO RELATED APPLICATIONS

This application is based upon, claims the benefit of priority of, and incorporates by reference the contents of, Japanese Patent Application No. 2004-354231 filed on Dec. 7, 2004 and Japanese Patent Application No. 2005-241135 filed on Aug. 23, 2005.

TECHNICAL FIELD

The technical field relates to a clamping circuit having a current mirror circuit and a transistor for clamping a voltage applied to a clamp terminal, and a transistor driving circuit constructed by using the clamping circuit.

BACKGROUND

JP-A-6-104672 discloses a clamping circuit having the construction shown in FIG. 6. The clamping circuit is equipped with a clamping transistor 201 provided between a terminal 200 and ground to clamp the voltage V appearing at the terminal 200 to a predetermined potential level, a resistor 202 for applying a gate voltage VG to the transistor 201, transistors 203, 204 for supplying constant current Lo to the resistor 202 and a constant current source 205.

The transistor 201 comprises a p-channel MOS transistor in which the source thereof is joined to the substrate and connected to the terminal 200 and the drain thereof is connected to the ground. The resistor 202 is constructed by a trimmable resistor such as a polysilicon resistor or the like, and the resistance value thereof is set to a desired value R. The resistor 202 is connected between the gate of the transistor 201 and ground and applies to the gate of the transistor 201 the constant voltage VG corresponding to the product lo×R of the current lo flowing in the resistor 202 itself and the resistance value R.

A transistor 203 is constructed by a p-channel MOS transistor. The substrate and the source thereof are commonly connected to each other, the source is connected to the terminal 200, the drain thereof is connected to a terminal 210, and the gate thereof is connected to the gate and drain of the transistor 204. The transistor 204 is also constructed by a p-channel MOS transistor. The substrate and the source thereof are commonly connected to each other, the source thereof is connected to the terminal 200, the drain thereof is connected to the gates of the transistors 203 and 204, and also connected to the constant current source 205. The transistors 203 and 204 constitute a current mirror circuit, and the constant current source 205 extracts constant current Lo from the transistor 204, so that the mirror current lo flows.

In the clamping circuit disclosed in JP-A-6-104672, it is needed to adjust the resistance value of the resistor 202 or the current value of the constant current source 205 in order to adjust the clamping voltage at the terminal 200. However, in order to design the resistor 202 so that it is trimmable, it is needed to separately provide the corresponding process. Accordingly, when it is not scheduled from the beginning to carry out such a process, it is difficult to form the trimming resistor.

When the trimming resistor is not usable, the gate potential of the transistor 201 serving as a reference voltage for the operation suffers a specific temperature effect which the constant current source 205 has.

SUMMARY

In view of the foregoing situation, it is an object to provide a clamping circuit for canceling the temperature characteristic of a current mirror circuit without using any trimming resistor, and a transistor driving circuit constructed by using the clamping circuit.

According to a clamping circuit of a first aspect, plural adjusting transistors are connected in parallel to a first transistor side constituting a current mirror circuit, and any one of the adjusting transistors is conducted by selectively switching the connection based on a switch circuit, whereby the amount of current flowing in a first transistor side and a second transistor side can be adjusted. The potential of the conduction control terminal of a clamping transistor is equal to a value achieved by subtracting a voltage drop at a resistance element from a power source voltage at the second transistor side. Accordingly, by adjusting the potential of the conduction control terminal, it is possible to adjust a clamp voltage with the conduction control terminal as a reference. Therefore, the temperature characteristic of the current mirror circuit can be cancelled by adjusting the clamp voltage without any trimming resistor.

According to a clamping circuit of a second aspect, since the current amounts flowing in the plural adjusting transistors when the plural adjusting transistors are conducted are different from one another, the mirror current can be adjusted in a more multiple-stage mode by changing the combination of the adjusting transistors and thus the adjustment of the clamp voltage can be performed in a broader range, or the adjustment of the clamp voltage can be performed by a smaller number of adjusting transistors and switch circuits.

According to a clamping circuit of a third aspect, the current amount flowing in the first transistor is set as a reference, and the current amount flowing in each adjusting transistor is set to $2^N$ times (N represents a natural number) of the current amount flowing in the first transistor. Accordingly, the mirror current can be adjusted in a $2^N$ multiple-stage mode with the reference current amount as a unit by combining the adjusting transistors of N and the switch circuit.

According to a clamping circuit of a fourth aspect, a temperature characteristic correcting transistor is connected between the second transistor and the resistance element so as to cancel the temperature characteristic of the clamping transistor. That is, if both the transistors are of the same type (have the same characteristic), the temperature characteristic of the clamping transistor can be cancelled by connecting the temperature characteristic correcting transistor so that the potential differences applied by the respective transistors under operation are offset when contributing to the clamping voltage.

According to a clamping circuit of a fifth aspect, each of the clamping transistor and the temperature characteristic correcting transistor is constructed by a P-channel MOSFET, the source of the clamping transistor is connected to a clamp terminal, the source of the temperature characteristic correcting transistor is connected to the resistance element, and the drain and gate of the temperature characteristic correcting transistor are connected to the gate of the clamping transistor. Here, when the power source voltage at the second transistor side is represented by V2, the current is represented by I2, the resistance value of the resistance element is represented by R2 and a threshold value voltage between the gate and source of the P-channel MOSFET is represented by Vth, the clamp voltage Vc is represented as follows:

$$Vc = V2 - R2 \times I2 - Vth + Vth = V2 - R \times I2.$$

Accordingly, the voltage of the clamping transistor which contributes to the clamp voltage Vc is offset and thus the temperature characteristic of the transistor concerned can be canceled.

According to a clamping circuit of a sixth aspect, adjustment data written from the external are held in an adjustment data output circuit. The adjustment data output circuit outputs the written adjustment data to each of the plural switch circuits to set the connection switching state of each switch circuit. Accordingly, the conduction state of each adjusting transistor can be adjusted by supplying data from the external, and the clamp voltage can be adjusted.

According to a clamping circuit of a seventh aspect, a serial interface circuit receives data transmitted from the external by serial communication and supplies the data to the adjustment data output circuit. Therefore, external terminals whose number is needed to directly write the data into the adjustment data output circuit are not needed to be prepared for the clamping circuit, and thus the outer size of the clamping circuit can be reduced.

According to a transistor driving circuit of an eighth aspect, the conduction control of a current supply transistor for supplying current to a load is carried out by the clamping circuit according to any one of the first to seventh aspects. That is, in this construction, there is a case where overcurrent is detected by using ON resistance of the current supply transistor, and in this case it is necessary to control the potential of the conduction control terminal so that the current supply transistor does not reach a saturation region, and to keep the potential on the basis of the state that the ON resistance is constant. The conduction control terminal potential of the current supply transistor of the clamping circuit can be properly set.

According to a ninth aspect, the current supply transistor is constructed by a P-channel MOSFET connected between the power source and the load. Therefore, the gate potential of the P-channel MOSFET is kept to be lower than the power source voltage at the source by a predetermined level, whereby the ON resistance of the FET concerned can be fixed.

BRIEF DESCRIPTION OF THE DRAWINGS

The above and other objects, features and advantages will become more apparent from the following detailed description made with reference to the accompanying drawings. In the drawings.

DETAILED DESCRIPTION (First Embodiment)

Figure 1:
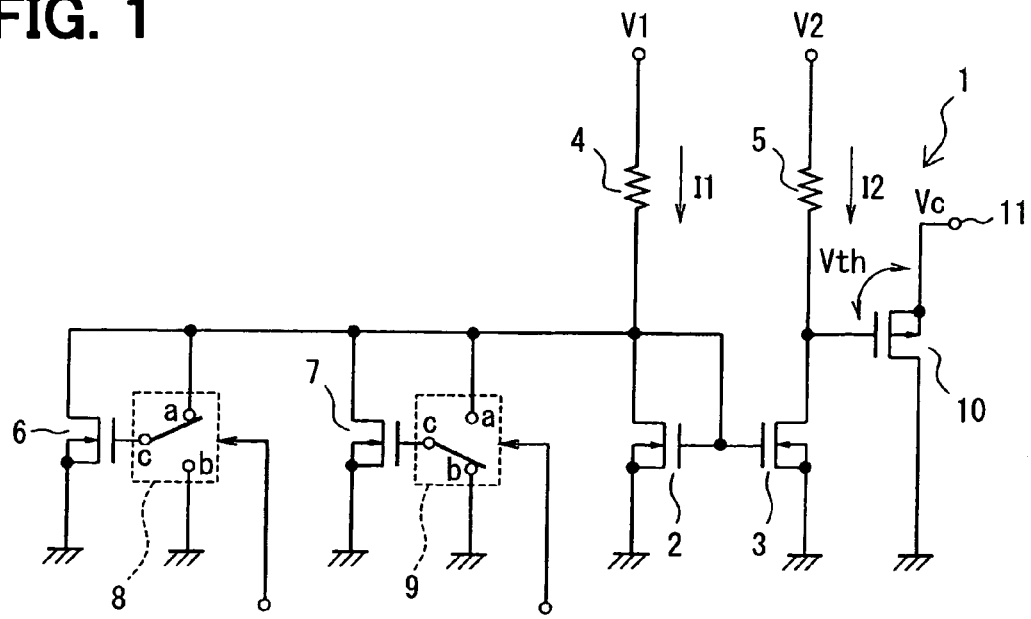
FIG. 1 is a diagram showing the electrical construction of a clamping circuit according to a first embodiment.

FIG. 1 shows the electrical construction of a clamping circuit according to a first embodiment. In the clamping circuit 1, N-channel MOSFETs 2 (first transistor) and 3 (second transistor) constitute a mirror pair, and the sources thereof are connected to the ground while the drains thereof are connected to reference voltages V1, V2 through resistance elements 4, 5, respectively. The gates of FETs 2, 3 are commonly connected to the drain of FET 2.

N-channel MOSFETs 6, 7 (adjusting transistors) are connected to FET 2 in parallel, and switch circuits 8, 9 each of which is constructed by an analog switch or the like are connected to FETs 6, 7. In the switch circuits 8, 9, a fixed contact point a is connected to the drain of FET 2, a fixed contact point b is connected to ground, and a movable contact point c is fixed to the gate of each of FETs 6, 7. Accordingly, when the movable contact point c is connected to the fixed contact point a side, FETs 6, 7 are turned on, and when the movable contact point c is connected to the fixed contact point b side, FETs 6, 7 are turned off.

The switching control of the switch circuits 8, 9 is determined in accordance with the level (high or low) of the adjustment data. The adjustment data is not specifically shown in the figures. However, it is written into a memory such as EEPROM or the like, and when the circuit is powered on, the data is read out and output to each of the switch circuits 8, 9.

Furthermore, the gate (conduction control terminal) of a P-channel MOSFET 10 (clamping transistor) is connected to the drain of FET 3, the drain of FET 10 is connected to the ground and the source of FET 10 is connected to a clamp terminal 11. FETs 2, 3, 6, 7 preferably comprise the same type of FETs (having the same characteristic), and the resistance elements 4, 5 are preferably constructed by the same type of resistance elements.

Next, operation of the clamping circuit according to this embodiment will be described.

In the clamping circuit 1, the voltage Vc of the clamping terminal 11 is determined as follows. When the current flowing to the FET 3 side is represented by I2, the resistance value of the resistance element 5 is represented by R2 and the value of the threshold voltage between the gate and source of FET 10 is represented by Vth, the following equation is satisfied:

$$Vc = V2 - R2 \times I2 + Vth.$$

Accordingly, the gate potential (V2−R2×I2) of FET 10 is adjusted by adjusting the current I2, whereby the clamp voltage Vc can be adjusted.

The current I2 is adjusted by switching the switch circuit 8, 9 at the FET 2 side to selectively conduct the FETs 6, 7. More particularly, if FETs 6, 7 are stepwise conducted, the current I1 flowing to the FET 2 side is increased in three stages in accordance with the combination of the above elements. In accordance with this stepwise increase of the current I1, the current I2 also increases, and the gate potential of FET 10, that is, the clamp voltage Vc is adjusted to be lower.

As described above, according to this embodiment, in the clamp circuit 1, the adjusting FETs 6, 7 are connected to the FET 2 side constituting the current mirror circuit in parallel, and the connection states of the switch circuits 8, 9 are switched, whereby the mirror current I1, I2 can be adjusted. The gate potential of FET 10 is equal to the value achieved by subtracting the voltage drop at the resistance element 5 from the power source voltage V2 at the FET 3 side, so that the clamp voltage Vc with the potential concerned as a reference can be adjusted by adjusting the gate potential. Accordingly, the temperature characteristic of the current mirror circuit can be canceled by adjusting the clamp voltage Vc without using any trimming resistor.

(Second Embodiment)

Figure 2:
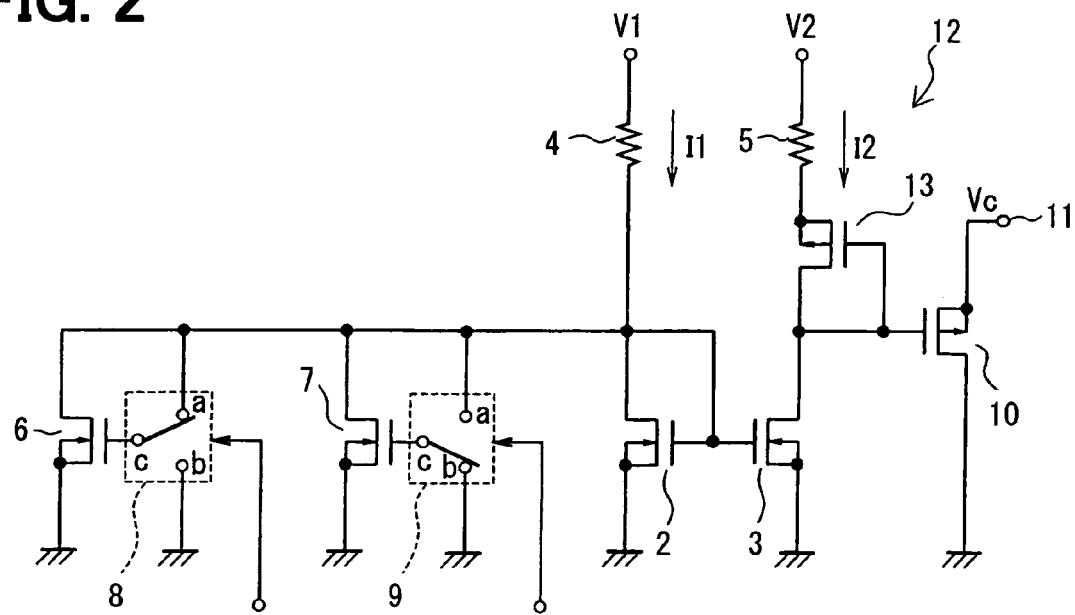
FIG. 2 shows a second embodiment corresponding to FIG. 1.

FIG. 2 shows a clamp circuit according to a second embodiment. In FIG. 2, the same elements as the first embodiment are represented by the same reference numerals, and the description thereof is omitted. Only the different portions will be described hereunder.

In a clamp circuit 12 of the second embodiment, a P-channel MOSFET 13 (temperature characteristic correcting transistor) is inserted between the resistance element 5 and the drain of FET 3. That is, the source of FET 13 is connected to the resistance element 5, and the drain and gate thereof are connected to the gate of FET 10. FET 13 is constructed by the same type of FET as FET 10.

Next, the operation of the second embodiment will be described. In the clamp circuit 12, the voltage Vc of the clamp terminal 11 is determined as follows as a result of the addition of FET 13. In this case, the threshold value voltage between the gate and source of FET 13 is also equal to Vth, and thus $$Vc=V2-R2\times I2-Vth+Vth=V2-R2\times I2.$$

That is, normally, FET 10 has a temperature characteristic, and when this temperature characteristic has an adverse effect on the clamp voltage Vc, it is preferable that the temperature characteristic concerned is canceled. By adding FET 13, the voltage Vth generated by FET 10 does not contribute to the clamp voltage Vc, so that the temperature characteristic of FET 10 is canceled.

As described above, according to the second embodiment, FET 13 is connected between the resistance element 5 and FET 3, and thus the temperature characteristic of FET 10 can be canceled.

(Third Embodiment)

Figure 3:
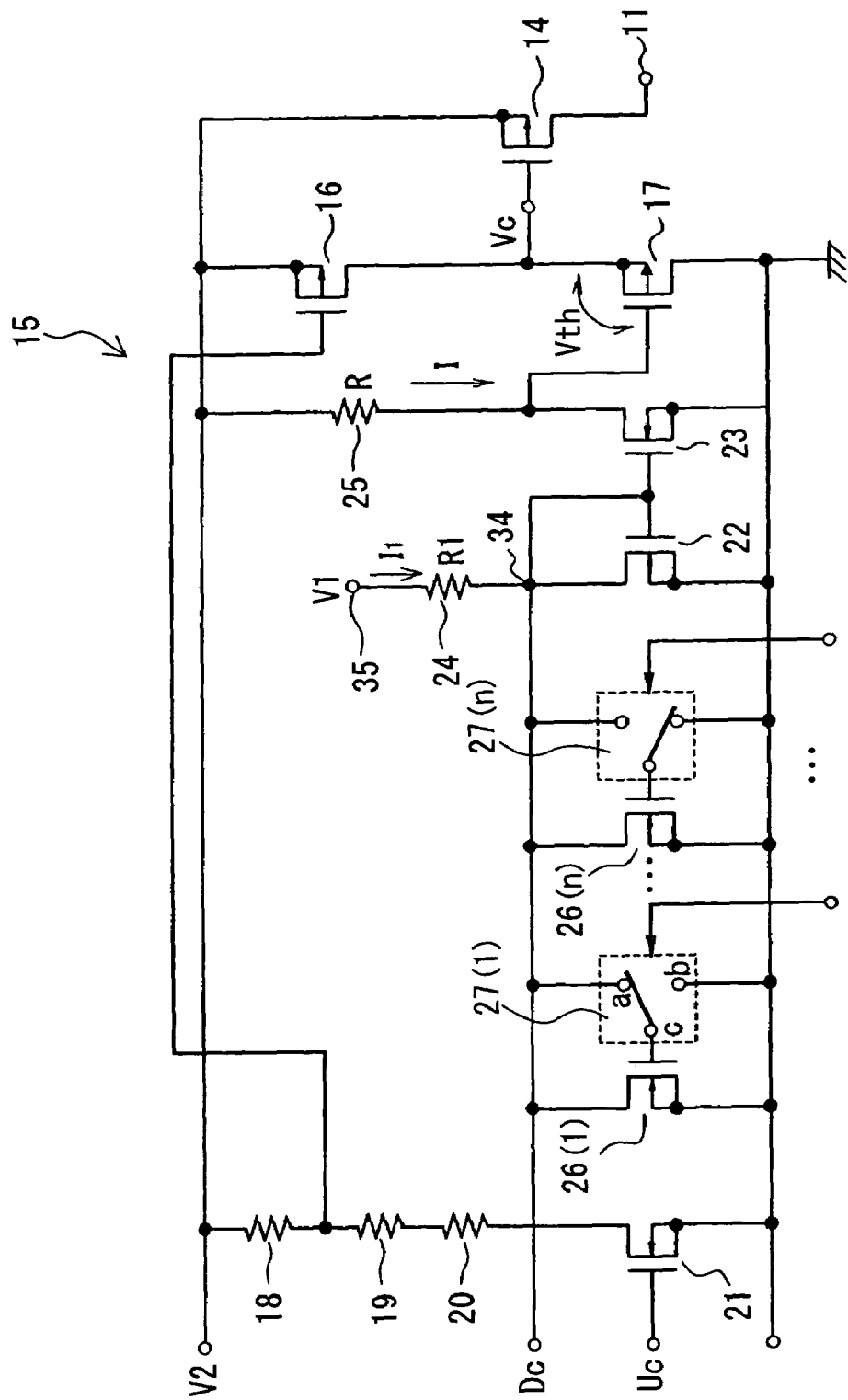
FIG. 3 shows a third embodiment, and is a diagram showing the construction in which the same construction as the clamping circuit of the first embodiment is applied to a driving circuit for driving a P-channel power MOSFET.
Figure 4:
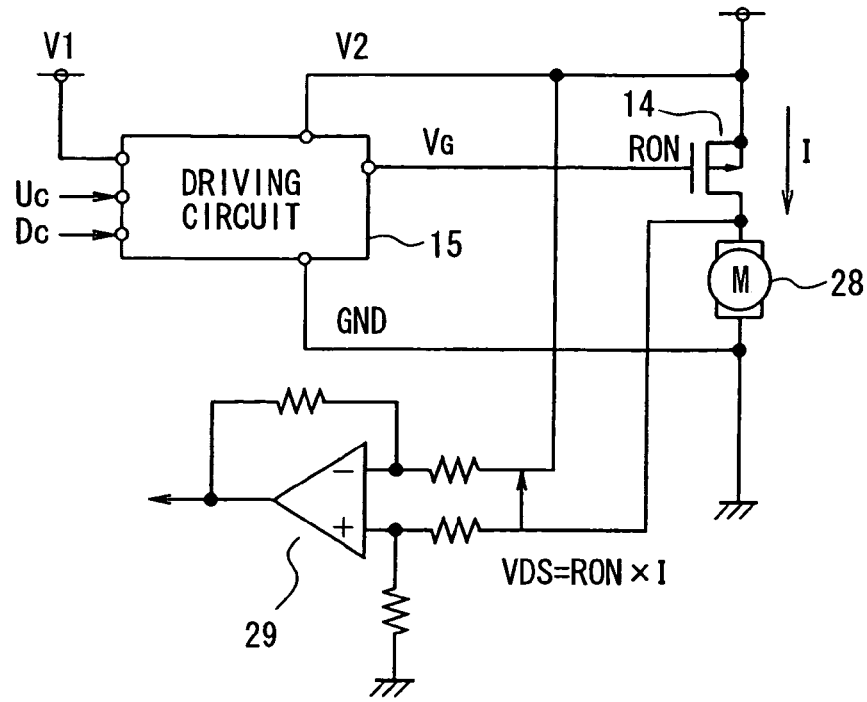
FIG. 4 is a diagram showing the overall construction containing a DC motor to which current is supplied from the power MOSFET.
Figure 6:
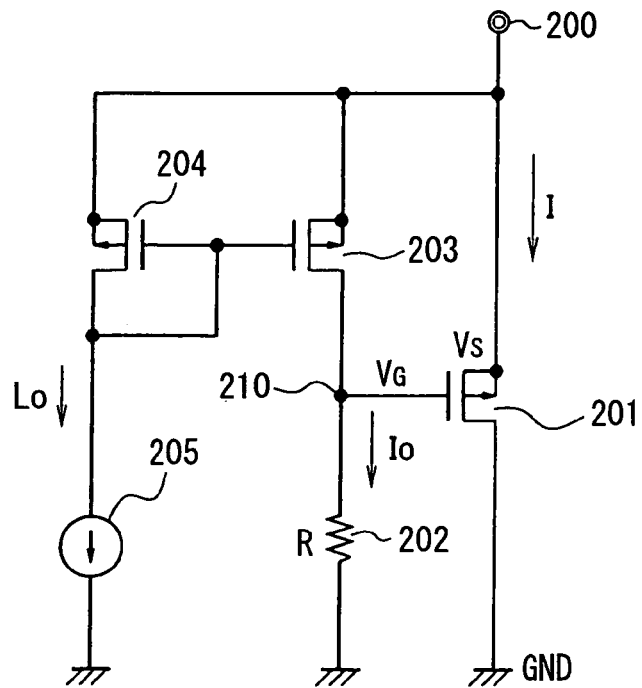
FIG. 6 shows a prior art, which corresponds to FIG. 1.

FIGS. 3 and 4 show a third embodiment of the clamp circuit. In the third embodiment, the same construction as the clamp circuit 1 of the first embodiment is applied to a transistor driving circuit 15 for driving the P-channel power MOSFET (current supply transistor) 14. That is, P-channel MOSFETs 16 and 17 are connected in a totem-pole connection style between the reference voltage V2 and the ground, and the drain of FET 16 and the source of FET 17, which are commonly connected to each other, are connected to the gate of FET 14.

Furthermore, an in-series circuit of resistance elements 18 to 20 and an N-channel MOSFET 21 are connected between the reference voltage V2 (for example, 14V) and the ground, and the gate of FET 16 is connected to the common connection point between resistance elements 18 and 19. The ON/OFF control of FET 16 is carried out by FET 21, and when the gate potential of FET 21 is set to a low level (ground), the gate potential of FET 16 is set to the reference voltage V2, and FET 16 is turned off. Furthermore, when the gate potential of FET 21 is set to a high level (reference voltage V1, for example 5V), FET 16 is turned on.

Two N-channel MOSFETs 22, 23 (first, second transistors) are connected to each other in the same style as FETs 2, 3 of the clamp circuit 1 to thereby constitute a current mirror circuit. The drain of FET 22 is connected to the reference voltage V1 through a resistance element 24, and the drain of FET 23 is connected to the reference voltage V2 through a resistance element 25. The gate of FET 17 (clamping transistor) is connected to the drain of FET 23.

Plural N-channel MOSFETs 26 (1 to n) as adjusting transistors are connected to the FET 22 side in parallel, and switch circuits 27 (1 to n) are connected in connection with the respective FETs 26 (1 to n). The drains of FETs 26 are connected to the driving control terminal 34, and when the potential of the driving control terminal 34 is set to a low level (ground) by setting terminal 35 to low level, the gate potential of FET 17 is set to the reference voltage V2, and FET 17 is turned off.

Furthermore, when the drain potential of FET 26 is set to a high level (V1−R1*I1) by setting terminal 35 to high level (reference voltage V1), current flows through the resistance element 25, and FET 17 is turned on. In this case, the gate potential VG of the P-channel power MOSFET 14 is clamped as follows as in the case of the first embodiment:

$$VG=V2-R\times I+Vth$$

Here, the resistance value of the resistance element 25 is represented by R and the flowing current is represented I.

Furthermore, FIG. 4 shows the overall construction containing a DC motor 28 as a load to which current is supplied by the power MOSFET 14. The motor 28 is connected between the drain of the power MOSFET 14 and ground, thereby high-side-driving the motor 28.

The source and drain of the power MOSFET 14 are connected to input terminals of an over-current detecting inversion amplifier 29 respectively. As described above, when the power MOSFET 14 is set to the conduction state, the driving circuit 15 controls the gate potential so that the conduction level of the power MOSFET 14 is not maximum (full ON). Therefore, the ON resistance RON of FET 14 is not varied and thus kept constant. Accordingly, the drain-source voltage VDS of FET 14 between the input terminals of the inversion amplifier 29 is represented by the following equation:

$$VDS=RON\times I,$$

wherein I represents the current flowing in FET 14. Accordingly, by detecting the voltage VDS, it can be detected that over-current flows in the motor 28.

As described above, according to the third embodiment, the conduction control of the power MOSFET 14 for supplying current to the motor 28 is carried out by the driving circuit 15 having the same construction as the clamping circuit 1 of the first embodiment. Accordingly, by keeping the state that the gate potential of FET 14 is kept to be lower than the reference voltage V2 at the source by a predetermined level so that FET 14 is prevented from reaching the saturated region, the over-current detection can be performed by the inversion amplifier 29 while the state that the ON resistance RON is fixed is set as a reference.

(Fourth Embodiment)

Figure 5:
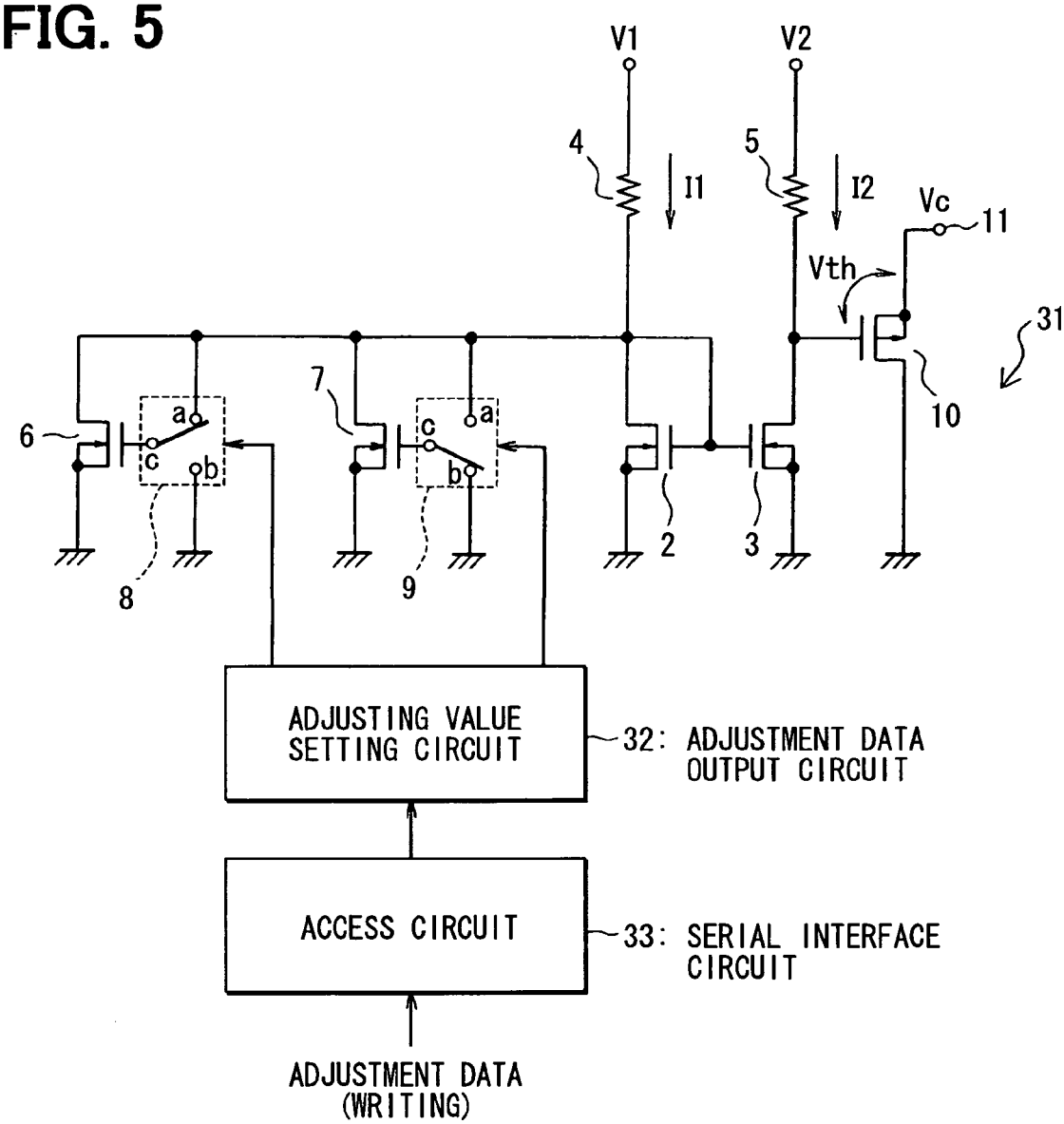
FIG. 5 shows a fourth embodiment, which corresponds to FIG. 1.

FIG. 5 shows a fourth embodiment of the clamp circuit 31, and only the different portions from the first embodiment will be described. A clamp circuit 31 of the fourth embodiment is constructed by adding the clamping circuit 1 of the first embodiment with an adjustment value setting circuit (adjustment data output circuit) 32 and an access circuit (serial interface circuit) 33. The adjustment value setting circuit 32 corresponds to a non-volatile memory such as EEPROM supplied with adjustment data to carry out the switching control of the switch circuits 8, 9 which are shown in FIG. 1. The access circuit 33 is a serial communication interface for receiving adjustment data transmitted from the external through serial communication, converts the reception data to parallel data and then outputs the parallel data to the adjustment value setting circuit 32 to write and set the data in the adjustment value setting circuit 32.

According to the fourth embodiment thus constructed, when the adjustment data are transmitted from the external to the clamping circuit 31 by serial communication, the access circuit 33 receives the data concerned, carries out the serial/parallel conversion on the data and writes the data thus converted into the adjustment value setting circuit 32. Then, the adjustment value setting circuit 32 outputs the adjustment data to the switch circuits 8, 9 while holding the written adjustment data, and thus the connection switching of the switch circuits 8, 9 is carried out on the basis of the data.

Accordingly, the ON/OFF switching operation of FETs 6, 7 can be carried out from the external. For example, even in a case where the power MOSFET 14 and the transistor driving circuit 15 as shown in FIG. 4 (third embodiment) are constructed as different chips and there is manufacturing dispersion in which variation of the ON resistance of FET 14 is induced when FET 14 and the clamping circuit 31 are used in combination because the ON resistance of FET 14 is dependent on the gate-source voltage VGS, the dispersion concerned can be adjusted in one-to-one correspondence, and the ON resistance of FET 14 can be set with high precision.

The present invention is not limited to the above embodiments disclosed in the specification and the drawings, and the following modifications may be made.

For example, in the first embodiment, FETs 6, 7 may be formed so that the channel widths thereof are different, whereby the current amounts increasing when they are turned on are different from each other. Furthermore, for example, when the FETs 2, 6, 7 are designed to have the relationship that the channel width of FET 2 is set to W and the channel widths of FETs 6, 7 are set to 2 W and 4 W respectively (that is, the relationship of $W \times 2^N$, N represents a natural number), four-stage adjustment can be performed by the combination of ON/OFF of FETs 6, 7, and thus the adjustment of the clamp voltage can be performed in a broader range or with a smaller number of adjusting transistors and switch circuits.

The construction of the second embodiment may be applied to the same type driving circuit as the third embodiment. Furthermore, the reference voltages V1 and V2 may be set to the same voltage. Furthermore, the relationship of the P, N channel MOSFETs may be reversed or a part thereof may be replaced by a bipolar transistor.

In the fourth embodiment, when an external terminal needed to directly write data into the adjustment value setting circuit 32 can be disposed in the clamping circuit 31, it is unnecessary to provide the access circuit 33.

What is claimed is:

1. A clamping circuit comprising:
    a current mirror circuit including transistors constituting a mirror pair disposed at ground side, each of the transistors being connected to a power source through a resistance element;
    a plurality of adjusting transistors connected in parallel to a first transistor as one transistor of the current mirror circuit at a side for determining mirror current flowing in the current mirror circuit;
    a plurality of switch circuits that are respectively connected to conduction control terminals of the plural adjusting transistors in connection with one another and control the conduction states of the corresponding adjusting transistors; and
    a clamping transistor that has a conduction control terminal connected to a power source side terminal of a second transistor as the other transistor of the mirror pair, and clamps a voltage applied to a clamp terminal with the potential of the conduction control terminal as a reference.

2. The clamping circuit according to claim 1, wherein the current amounts flowing in the plural adjusting transistors when the plural adjusting transistors are conducted are set to be different from one another.

3. The clamping circuit according to claim 2, wherein the current amounts flowing in the respective adjusting transistors are set to have a $2^N$-multiple relationship with the current amount flowing in the first transistor as a reference, wherein N represents a natural number.

4. The clamping circuit according to claim 1, further comprising a temperature characteristic correcting transistor connected between the second transistor and the resistance element so that the temperature characteristic of the clamping transistor is canceled.

5. The clamping circuit according to claim 4, wherein when each of the clamping transistor and the temperature characteristic correcting transistor is constructed by a P-channel MOSFET, the source of the clamping transistor is connected to the clamp terminal, and the source of the temperature characteristic correcting transistor is connected to the resistance element while the drain and gate of the temperature characteristic correcting transistor are connected to the gate of the clamping transistor.

6. The clamping circuit according to claim 1, further comprising an adjustment data output circuit that is supplied with adjustment data and outputs each of the adjustment data to the plural switch circuits to set the connection switching of the respective switch circuits.

7. The clamping circuit according to claim 6, further comprising a serial interface circuit for receiving externally transmitted data by serial communication and supplying the data thus received to the adjustment data output circuit.

8. A transistor driving circuit including a current supply transistor connected to a load in series to supply current to the load, the conduction control of the current supply transistor being carried out by the clamping circuit according to claim 1.

9. The transistor driving circuit according to claim 8, wherein the current supply transistor is constructed by a P-channel MOSFET connected between the power source and the load.

* * * * *

UNITED STATES PATENT AND TRADEMARK OFFICE
CERTIFICATE OF CORRECTION

| | |
|---|---|
| PATENT NO. | : 7,215,172 B2 |
| APPLICATION NO. | : 11/295536 |
| DATED | : May 8, 2007 |
| INVENTOR(S) | : Kenji Ito |

It is certified that error appears in the above-identified patent and that said Letters Patent is hereby corrected as shown below:

On the title page item (54) and col. 1, line 1, correct at follows:

CLAMPING CIRCUIT "AND" TRANSISTOR DRIVING CIRCUIT USING THE SAME

Signed and Sealed this

Fourth Day of December, 2007

JON W. DUDAS
*Director of the United States Patent and Trademark Office*